United States Patent
Kirschbaum

(10) Patent No.: US 7,243,326 B2
(45) Date of Patent: Jul. 10, 2007

(54) CLIENT-SPECIFIC CIRCUIT BOARD WITH ISOLATED REDUNDANT SYSTEMS

(75) Inventor: Andreas Kirschbaum, Griesheim (DE)

(73) Assignee: Continental Teves AG & Co, oHG, Frankfurt (DE)

(*) Notice: Subject to any disclaimer, the term of this patent is extended or adjusted under 35 U.S.C. 154(b) by 592 days.

(21) Appl. No.: 10/470,402

(22) PCT Filed: Jan. 17, 2002

(86) PCT No.: PCT/EP02/00416

§ 371 (c)(1),
(2), (4) Date: Jul. 18, 2003

(87) PCT Pub. No.: WO02/057963

PCT Pub. Date: Jul. 25, 2002

(65) Prior Publication Data

US 2004/0060025 A1    Mar. 25, 2004

(30) Foreign Application Priority Data

Jan. 19, 2001 (DE) .............................. 101 02 499
Oct. 10, 2001 (DE) .............................. 101 49 930

(51) Int. Cl.
*G06F 17/50* (2006.01)
*G06F 9/45* (2006.01)

(52) U.S. Cl. ...................... 716/10; 716/1; 716/8
(58) Field of Classification Search ............ None
See application file for complete search history.

(56) References Cited

U.S. PATENT DOCUMENTS 6,185,721 B1* 2/2001 Hosokawa ............. 716/5
6,275,752 B1* 8/2001 Giers ................... 701/29

OTHER PUBLICATIONS

Bannatyne, R., "Dependable auto systems emerge," EE Times, Jul. 28, 2000, 4 pages, http://www.eetimes.com/story/OEG20000728S0023.*
R.E. Lyons et al., "The Use of Triple-Modular Redundancy to Improve Computer Reliability," IBM journal, Apr. 1962, pp. 200-209.*
S.E. Smith, "Triple Redundant Fault Tolerance: A Hardware-Implemented Approach," ISA Transactions, vol. 30, No. 4, 1991, pp. 87-95.*

* cited by examiner

Primary Examiner—Leigh M. Garbowski

(57) ABSTRACT

An automated method for producing integrated circuit arrangements for automotive vehicle control systems provides at least two logically isolated subsystems (5, 6) and, in addition to the logical isolation, effects a spatial (physical) isolation of the subsystems on the surface available on the circuit arrangement.

7 Claims, 1 Drawing Sheet

CLIENT-SPECIFIC CIRCUIT BOARD WITH ISOLATED REDUNDANT SYSTEMS

BACKGROUND OF THE INVENTION

The present invention relates to a method for producing integrated circuit arrangements for automotive vehicle control systems by establishing a layout using an automated method.

Various methods for the design of client-specific integrated circuits (ASICS, FGPAs) in the field of microelectronics are known in the art. ASIC (Application Specific Integrated Circuit) refers to an integrated circuit (IC, 'chip') that has been developed related to the client or application-specifically. ASICs are employed when an optimum is demanded in terms of overall size, efficiency and low power dissipation. Depending on ASIC technology, a cost benefit is achieved already starting from relatively small quantities. The spectrum reaches from simple, programmable structural elements (PLDs) via more complex, freely programmable gate arrays (FPGAs) up to full custom ASICs with analog and digital component. Mask sets (Layout) for specific methods of producing circuits (e.g. CMOS, BICMOS) of defined companies may be produced by a customer by way of assembling complex components (IP) that can be polled from libraries with a per se known appropriate development software such as OCEAN of Delft University (NL), Synopsis or CADENCE. The development tools thus permit designing micro-circuits within limits defined by the manufacturer. The development of circuits utilizes hardware descriptive languages like VHDL, Verilog or by means of SDL for signal-flow oriented applications.

In electronic control devices for controlling the brakes of motor vehicles, e.g. in electronic driving dynamics control systems (ESP) or anti-lock systems (ABS), the regulation and control of most various functions is performed by microprocessor systems. As is known, safety-critical electronic circuits have a totally or partially redundant design in view of the high degree of reliability demanded from corresponding control devices.

A basic principle of redundancy is that the subsystems available several times (e.g. two equal microprocessors) operate independently of one another and can monitor or correct each other. It is, however, also possible that the proper function of these multiply provided subsystems is compared by a third circuit unit and, when a deviation of the function occurs, further suitable steps may be taken.

When corresponding circuits with redundancy are developed by means of per se known development tools such as CADENCE, the multiply provided subsystems are usually interlaced more or less.

It has shown that the circuit arrangements produced by means of the previously described development tools do not yet satisfy in full the demands placed on them in terms of reliability of operation.

SUMMARY OF THE INVENTION

Therefore, the present invention discloses a method in which at least two logically isolated subsystems (5, 6) are provided and, in addition to the logical isolation, a spatial (physical) isolation of the subsystems is effected on the surface available on the circuit arrangement, thereby allowing further increase of the reliability of operation of the produced circuit arrangements.

According to the method of the invention, integrated circuit arrangements for automotive vehicle control systems are produced by establishing a layout by means of an automated method, said method being preferably carried out either automatically in a computer system or partly automatically in such a way that persons in charge (e.g. development engineers) get into interaction with a computer system.

For circuit arrangements that preferably contain a plurality of integrated partly or fully redundant subsystems, it is expedient for a maximum reliable function to execute a physical isolation of the subsystems during the layout design in addition to the logical isolation.

The isolated subsystems are preferably redundant circuits (5, 6) of an electronic control device for automotive vehicles, in particular of an electronic control device for automotive vehicle brake systems.

Advantageously, all subsystems of the circuit arrangement produced are located on one joint chip.

The subsystems are isolated physically according to the invention. It has proven that if the subsystems are not physically isolated to a sufficient extent, cross couplings of the subsystems may occur, the error analysis thereof being extremely time-consuming or even impossible.

The circuit arrangements are preferably produced using development tools that are appropriate for achieving wiring networks, such as CADENCE in particular. With corresponding development tools being implemented on current computer systems in the form of a computer program, prefabricated semiconductor chips (semi-custom design) may be completed in conformity with the requirements set.

The prefabricated semiconductor chips especially concern those being produced in Sea-Of-Gates technology.

The complete physical isolation of subsystems is not supported to a sufficient degree in the Sea-Of-Gates technology with the currently available mask fabrication tools to produce strip conductor structures. Thus, for example, the automated process of 'disentangling' the networks (routing) using an autorouter often causes the above-mentioned undesirable cross-couplings. The consequence is a complicated manual examination process (review process) wherein the ready layout needs finishing to achieve the logical and physical isolation.

BRIEF DESCRIPTION OF THE DRAWING

In the accompanying drawing.

DETAILED DESCRIPTION OF THE DRAWING

Figure 1:
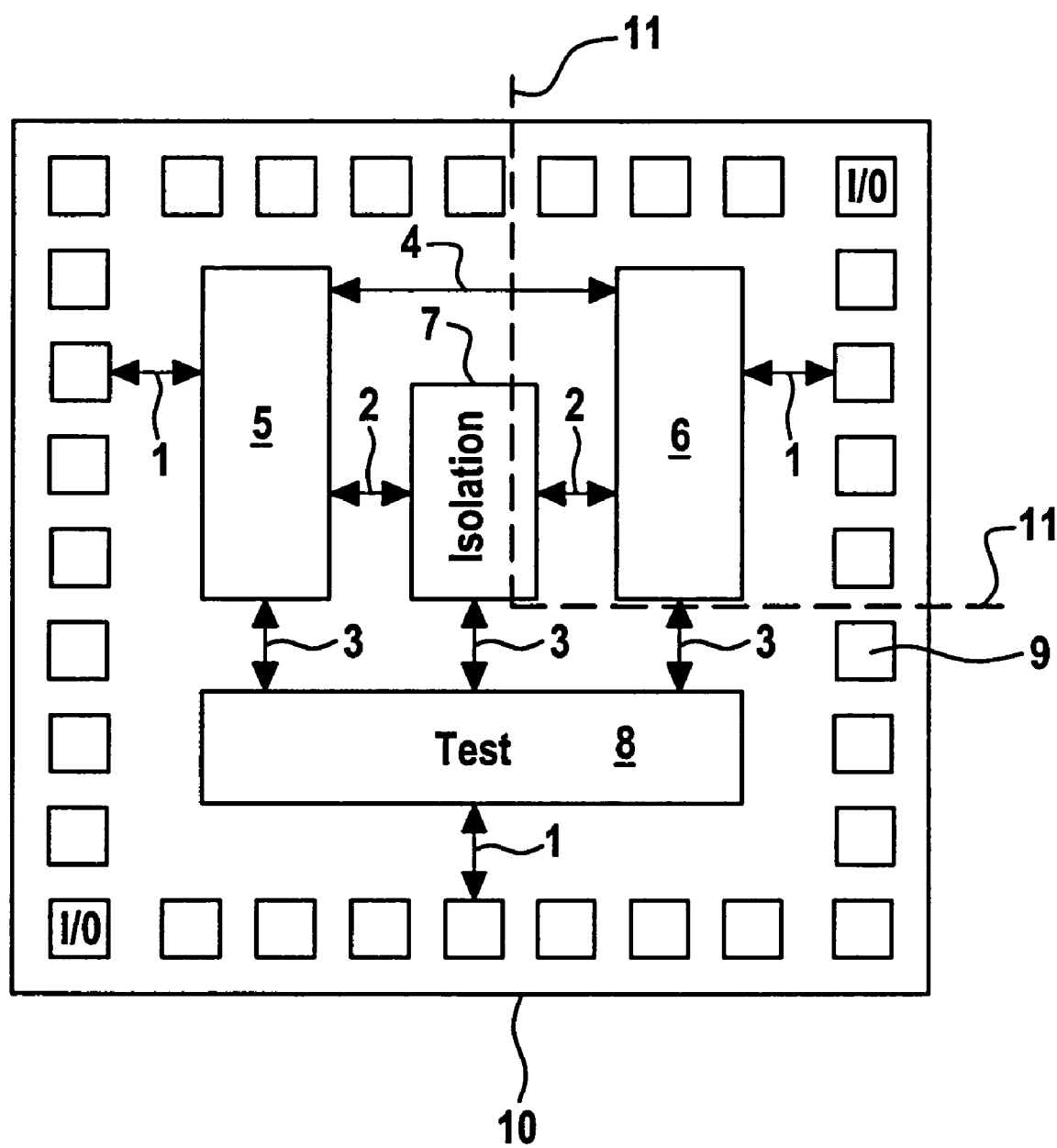
FIG. 1 shows an example of a hardware system that can be produced according to the method of the invention and is applicable in electronic brake systems.

FIG. 1 shows a layout on microchip 10 for a microcontroller, said layout having a two times redundant design. On chip 10 two redundant subsystems 5 and 6 are provided which substantially internally have an equal configuration. Isolation module 7, through which reliable connections 2 of the subsystems (e.g. clocked supply, reset, comparison results, etc.) are passed, isolates both subsystems. For reasons of complexity, test logic 8 for monitoring fail-free operation that is also arranged on said chip normally does not have a redundant design. The subsystems 5 and 6 as well as the test logic 8 are connected to contact surfaces 9 for the electrical supply lines of the chip by way of connections 1.

For the purpose of physically isolating the subsystems 5 and 6, validation (as described in the following) is performed according to the method of the invention.

Initially, a logical isolation is effected in the register transmission level (RTL level). Each entity of the hardware descriptive language (HDL entity) is associated with a subsystem of a defined system class during drafting the register transmission level.

The classes in the present example are:

A) subsystem 5,

B) subsystem 6,

C) isolation module 7, and

D) test module 8.

Subsequently all bus systems on the highest design level (RTL top level) are replaced logically by multiple point-to-point connections. Based on the description drafted as explained above, all connections between the classes A) to D) are automatically extracted by way of a script (e.g. using the synthesis tool) and classified as follows:

Class 1: connections 1 to the contact surfaces 9,
Class 2: connections 2 from the partial modules 5, 6 to the isolation module 7,
Class 3: connections 3 to the test module 8, and
Class 4: connections 4 between the partial modules 5, 6.

Thus, an automated possibility of examining the physical isolation on the layout level is provided by the classification of the modules and connections that is performed according to the above-described method.

When the mentioned classification process is completed, the results are automatically evaluated according to the following rules (per script):

Rule 1: classes 1 to 3 represent reliable connections and should be ignored.
Rule 2: if class 4 is not empty, this means an error in the logical isolation of the subsystems. The initially established design will need modification in this case. Subsequently, the preceding steps will be processed again.

When the above-described part of the method is completed, the design of the layout level (physical isolation) is performed.

The individual classes described hereinabove are initially colored automatically according to the script, and the location of the assigned cells is tested optically by means of the layout tool.

Now an imaginary physical line of separation 11 is determined in the layout, which line extends through the isolation module 7 and isolates the two subsystems in such a way that the test module 8 is placed on the isolated side of only one of the subsystems. Then all lines that cross the line of separation 11 in the layout are detected by way of the layout tool. The detected lines are then compared automatically with the connections already found on the RTL level.

When now additional connections are found, there is a defect in the physical isolation. The layout must undergo modification in this case.

The method described permits an accelerated development of integrated electronic circuit arrangements with multiply designed subsystems because errors that occur can already be corrected in an early design phase. In contrast thereto, the logical isolation of the subsystems is tested manually and optically in prior art methods only at the end of the draft run after completion of the layout. If defects are found then—what is a frequent occurrence—a design becomes necessary that must be executed again and is considerably time-consuming and cost-intensive.

The invention claimed is:

1. An integrated circuit arrangement for automotive vehicle control systems manufactured by establishing a layout using an automated method,
    including a surface that accommodates at least two logically isolated subsystems (5, 6) which, in addition to the logical isolation, are also spatially (physically) isolated on the surface available on the circuit arrangement,
    further comprising defined classes of subsystems with each entity of the hardware descriptive language (HDL) being associated with one subsystem of a defined class and the subsystems being logically isolated on the register transmission level (RTL).

2. The circuit arrangement as claimed in claim 1, wherein the isolated subsystems are redundant circuits (5, 6) of an electronic control device for automotive vehicles.

3. The circuit arrangement as claimed in claim 1, wherein the integrated circuit arrangement is a client-specific circuit (ASIC) which was produced in Sea-Of-Gates technology.

4. The circuit arrangement as claimed in claim 1, including several point-to-point connections logically replacing all bus systems on the highest design level (RTL top level) after the logical isolation.

5. The circuit arrangement as claimed in claim 4, wherein the established point-to-point connections are subdivided into classes.

6. The circuit arrangement as claimed in claim 1, comprising a common test logic (8) connected to the existing subsystems by way of a bus system (3).

7. The circuit arrangement as claimed in claim 1, comprising
    an isolation module (7) which is connected to the existing subsystems by way of bus systems (2), and
    a separation line intended for disentangling the bus systems (1, 2, 3) through the isolation module.

* * * * *